US012557537B2

(12) United States Patent
Lee et al.

(10) Patent No.: US 12,557,537 B2
(45) Date of Patent: Feb. 17, 2026

(54) LIGHT EMITTING DISPLAY DEVICE

(71) Applicant: Samsung Display Co., LTD., Yongin-si (KR)

(72) Inventors: Jin Hyeong Lee, Yongin-si (KR); Dae Won Kim, Yongin-si (KR); Su Jeong Kim, Yongin-si (KR); Jong Ho Son, Yongin-si (KR); Hyebeom Shin, Yongin-si (KR); Kyung Hee Lee, Yongin-si (KR); Sun-Young Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 397 days.

(21) Appl. No.: 18/355,531

(22) Filed: Jul. 20, 2023

(65) Prior Publication Data

US 2024/0180010 A1    May 30, 2024

(30) Foreign Application Priority Data

Nov. 25, 2022  (KR) .................. 10-2022-0160541

(51) Int. Cl.
*H10K 59/80* (2023.01)
*H10K 59/122* (2023.01)

(52) U.S. Cl.
CPC ....... *H10K 59/8792* (2023.02); *H10K 59/122* (2023.02)

(58) Field of Classification Search
CPC .................. H10K 59/8792; H10K 59/122
See application file for complete search history.

(56) References Cited

U.S. PATENT DOCUMENTS

| 2022/0005906 | A1* | 1/2022 | Jeong | H10K 59/121 |
| 2022/0199702 | A1* | 6/2022 | Park | H10K 50/86 |
| 2022/0238606 | A1* | 7/2022 | Jeong | H10K 59/38 |
| 2024/0074296 | A1 | 2/2024 | Son et al. | |

FOREIGN PATENT DOCUMENTS

| KR | 10-2016-0066635 | 6/2016 |
| KR | 10-2017-0014043 | 2/2017 |
| KR | 10-2019-0079249 | 7/2019 |
| KR | 10-2024-0027917 | 3/2024 |

* cited by examiner

*Primary Examiner* — Anne M Hines
(74) *Attorney, Agent, or Firm* — Womble Bond Dickinson (US) LLP

(57) ABSTRACT

A light emitting display device according to an embodiment includes a driving element layer disposed on a substrate, a light emitting element layer disposed on the driving element layer, and an external light decreasing layer disposed on the light emitting element layer. The light emitting element layer includes an anode, a pixel defining film having a first opening exposing at least a portion of the anode, a light emitting layer disposed on the anode in the first opening of the pixel defining film, and a cathode disposed on the light emitting layer and the pixel defining film. The external light decreasing layer includes an inorganic material having an absorption coefficient of greater than or equal to about 1.5, and includes a reflection control layer having a second opening corresponding to the first opening of the pixel defining film.

20 Claims, 14 Drawing Sheets

FIG. 4

|    | Absorption coefficient | T1 (@ vapor pressure 1Pa) |
|----|------------------------|---------------------------|
| Bi | 3.0                    | 668                       |
| Yb | 1.7                    | 463                       |
| Mg | 5.4                    | 428                       |
| Ca | 2.6                    | 591                       |
| Mn | 3.4                    | 955                       |
| Sn | 7.28                   | 807                       |
| Zn | 4.98                   | 177                       |
| In | 4.95                   | 597                       |

FIG. 12

|  | Reflectance (SCI) | Reflectance (SCE) | a* | b* |
|---|---|---|---|---|
| Comparative example | 8.4 | 0.8 | 21.8 | -33.5 |
| Embodiment | 7.2 | 0.9 | 12.9 | -24.5 |

LIGHT EMITTING DISPLAY DEVICE

CROSS REFERENCE TO RELATED APPLICATION(S)

This application claims priority to and the benefits of Korean Patent Application No. 10-2022-0160541 under 35 U.S.C. § 119, filed on Nov. 25, 2022, in the Korean Intellectual Property Office (KIPO), the entire contents of which are incorporated herein by reference.

BACKGROUND

1. Technical Field

The disclosure relates to a light emitting display device with reduced reflectance of external light without using a polarizing plate.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, various terminals, and the like.

A light emitting display device such as the OLED display may have a structure in which the display device is bendable or foldable using a flexible substrate.

The light emitting display device is a self-emitting display device, and displays an image by emitting light from a light emitting element.

On the other hand, the liquid crystal display displays an image by adjusting a degree of blocking light provided from a light part, and includes not only a liquid crystal layer but also two polarizers on top and bottom to block light.

Therefore, in general, the light emitting display device may display an image without including a polarizing plate, unlike the liquid crystal display.

The above information disclosed in the Background section is only for enhancement of understanding of the background of the disclosure, and therefore it may contain information that does not form a prior art that is already known in this country to a person of ordinary skill in the art.

SUMMARY

Embodiments are to provide a light emitting display device with increased luminance of a side surface or improved reflective color of external light.

A light emitting display device according to an embodiment may include a driving element layer disposed on a substrate, a light emitting element layer disposed on the driving element layer, and an external light decreasing layer disposed on the light emitting element layer. The light emitting element layer may include an anode, a pixel defining film having a first opening exposing at least a portion of the anode, a light emitting layer disposed on the anode in the first opening of the pixel defining film, and a cathode disposed on the light emitting layer and the pixel defining film. The external light decreasing layer may include an inorganic material having an absorption coefficient of greater than equal to about 1.5, and include a reflection control layer having a second opening corresponding to the first opening of the pixel defining film.

The reflection control layer may include bismuth (Bi), ytterbium (Yb), magnesium (Mg), calcium (Ca), manganese (Mn), tin (Sn), zinc (Zn), indium (In), the like, or a combination thereof.

The external light decreasing layer may further include a low-reflection inorganic layer, and the low-reflection inorganic layer may overlap the first opening of the pixel defining film in a plan view.

The low-reflection inorganic layer may include an inorganic material having an absorption coefficient of greater than equal to about 0.5 and a refractive index of greater than equal to about 1.

The low-reflection inorganic layer may include bismuth (Bi).

The external light decreasing layer may further include a capping layer.

The reflection control layer may be disposed on the capping layer, and the low-reflection inorganic layer may be disposed on the reflection control layer.

The low-reflection inorganic layer may be disposed on the capping layer, and the reflection control layer may be disposed on the low-reflection inorganic layer.

The capping layer may be disposed on the reflection control layer, and the low-reflection inorganic layer may be disposed on the capping layer.

An area of the second opening of the reflection control layer may be greater than an area of the first opening of the pixel defining film in a plan view, and the second opening may overlap the first opening of the pixel defining film in a plan view.

The substrate, the driving element layer, the light emitting element layer, and the external light decreasing layer may be disposed in a lower display panel. The light emitting element layer may further include an encapsulation substrate facing the lower display panel, a sealant attaching the lower display panel and the encapsulation substrate, and a filling layer disposed between the lower display panel, the encapsulation substrate, and the sealant. The light emitting display device may not include a polarizing plate.

A light emitting display device according to another embodiment may include a driving element layer disposed on a substrate, a light emitting element layer disposed on the driving element layer, and an external light decreasing layer disposed on the light emitting element layer. The light emitting element layer may include an anode, a pixel defining film having a first opening exposing at least a portion of the anode, a light emitting layer disposed on the anode in the first opening of the pixel defining film, and a cathode disposed on the light emitting layer and the pixel defining film. The external light decreasing layer may include a reflection control layer and a low-reflection inorganic layer, the reflection control layer may include an inorganic material having an absorption coefficient of greater than equal to about 1.5 and may have a second opening corresponding to the first opening of the pixel defining film, and the low-reflection inorganic layer may include an inorganic material having an absorption coefficient of greater than equal to about 0.5 and a refractive index of greater than equal to about 1.

The low-reflection inorganic layer may include bismuth (Bi).

The reflection control layer may include bismuth (Bi), ytterbium (Yb), magnesium (Mg), calcium (Ca), manganese (Mn), tin (Sn), zinc (Zn), indium (In), the like, or a combination thereof.

The external light decreasing layer may further include a capping layer.

The reflection control layer may be disposed on the capping layer, and the low-reflection inorganic layer may be disposed on the reflection control layer.

The low-reflection inorganic layer may be disposed on the capping layer, and the reflection control layer may be disposed on the low-reflection inorganic layer.

The capping layer may be disposed on the reflection control layer, and the low-reflection inorganic layer may be disposed on the capping layer.

An area of the second opening of the reflection control layer may be greater than an area of the first opening of the pixel defining film in a plan view, and the second opening may overlap the first opening of the pixel defining film in a plan view.

The substrate, the driving element layer, the light emitting element layer, and the external light decreasing layer may be disposed in a lower display panel. The light emitting element layer may further include an encapsulation substrate facing the lower display panel, a sealant attaching the lower display panel and the encapsulation substrate, and a filling layer disposed between the lower display panel, the encapsulation substrate, and the sealant. The light emitting display device may not include a polarizing plate.

According to the embodiments, a light blocking layer may not be formed on an upper encapsulation substrate of a light emitting display device so that luminance of a side surface is increased.

According to the embodiments, a reflection control layer adjusting reflectance or reflective color may be formed at an upper surface of a substrate of the light emitting display device so that reflectance of external light may be reduced or reflective color may be adjusted.

BRIEF DESCRIPTION OF THE DRAWINGS

FIG. 4 is a table listing materials usable for a reflection control layer of the light emitting display device according to an embodiment.

FIG. 12 is a table comparing a characteristic between the comparative embodiment and the embodiment.

DETAILED DESCRIPTION OF THE EMBODIMENTS

Figure 1:
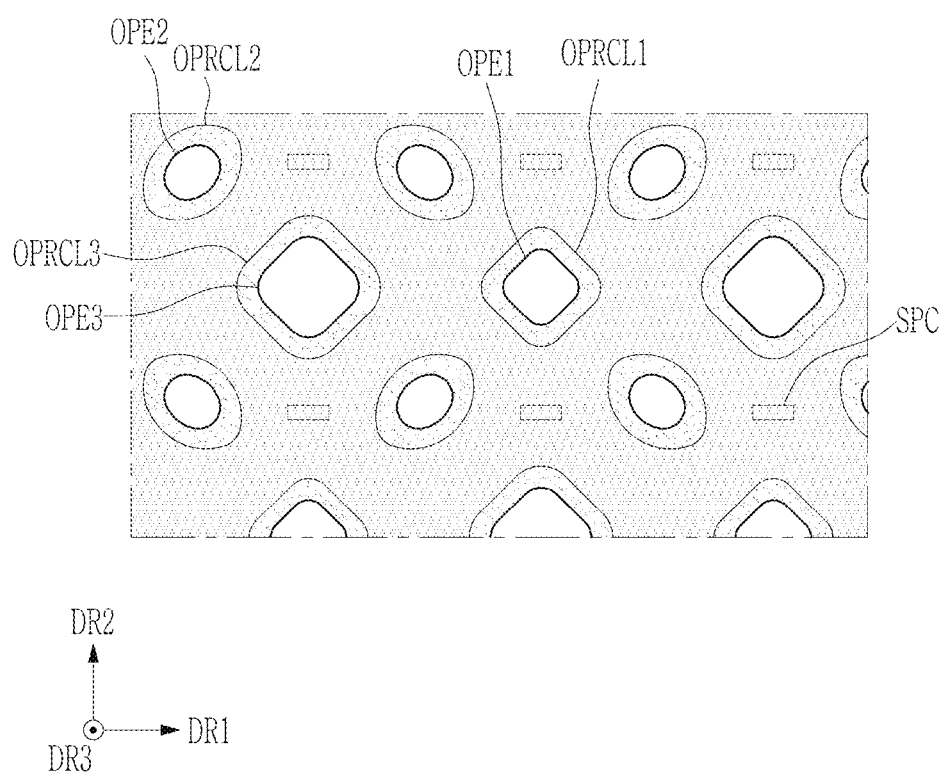
FIG. 1 is a schematic plan view of a portion of a light emitting display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

In order to clearly describe the disclosure, parts or portions that are irrelevant to the description are omitted, and identical or similar constituent elements throughout the specification are denoted by the same reference numerals.

In the drawings, the size and thickness of each element are arbitrarily illustrated for case of description, and the disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, substrate, plate, or constituent element is referred to as being "on" or "above" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements. Moreover, the terminology used herein is for the purpose of describing particular embodiments and is not intended to be limiting. As used herein, the singular forms, "a," "an," and "the" are intended to include the plural forms as well, unless the context clearly indicates otherwise. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Spatially relative terms, such as "beneath," "below." "under." "lower." "above." "upper." "over." "higher." "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the example term "below" can encompass both an orientation of above and below. Furthermore, the apparatus may be otherwise oriented (e.g., rotated 90 degrees or at other orientations), and, as such, the spatially relative descriptors used herein interpreted accordingly.

Throughout the specification, the phrase "in a plan view" or "on a plane" means viewing a target portion from the top, and the phrase "in a cross-sectional view" or "on a cross-section" means viewing a cross-section formed by vertically cutting a target portion from the side.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the first direction DR1, the second direction DR2, and the third direction DR3 are not limited to three axes of a rectangular coordinate system, such as the x, y, and z axes, and may be interpreted in a broader sense. For example, the first direction DR1, the second direction DR2, and the third direction DR3 may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only. Z only, or any combination of two or more of X, Y, and Z, such as, for instance, XYZ, XYY, YZ, and ZZ.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Throughout the specification, when it is said that an element such as a wire, layer, film, region, area, substrate, plate, or constituent element "is extended (or extends) in a first direction or second direction", this does not only mean a straight shape extending straight in the corresponding direction, but may also mean a structure that substantially extends in the first direction or the second direction, is partially bent, has a zigzag structure, or extends while having a curved structure.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

An electronic device (for example, a mobile phone, a TV, a monitor, a laptop computer, or the like) included in a display device, a display panel, or the like described in the specification, or an electronic device included in a display device, a display panel, or the like manufactured by a manufacturing method described in the specification may not be excluded from a scope of the specification.

Hereinafter, a planar structure of a light emitting display device according to an embodiment will be described with reference to FIG. 1.

FIG. 1 is a schematic plan view of a portion of the light emitting display device according to the embodiment.

In FIG. 1, multiple openings (hereinafter also referred to as first openings) OPE1, OPE2, and OPE3 of a pixel defining film (see, e.g., 380 of FIG. 2) and multiple openings (hereinafter also referred to as second openings) OPRCL1, OPRCL2, and OPRCL3 of a reflection control layer (or a reflection adjusting layer) (see, e.g., RCL of FIG. 2) that adjusts reflectance or reflection color are shown. The pixel defining film may be formed of a black organic material including a light blocking material. The reflection control layer may be disposed on an upper side in a third direction DR3 of the pixel defining film, may be formed of a material (e.g., Bi, Yb, or the like) having an absorption coefficient (k) of greater than or equal to about 1.5, and may be thermally deposited. In an embodiment, a material forming the reflection control layer will be described in detail in FIG. 4.

In FIG. 1, the first openings OPE1, OPE2, and OPE3 of the pixel defining film 380 and the second openings OPRCL1, OPRCL2, and OPRCL3 of the reflection control layer may overlap each other in a plan view. The second openings OPRCL1, OPRCL2, and OPRCL3 of the reflection control layer may have a larger area than the first openings OPE1, OPE2, and OPE3 of the pixel defining film in a plan view, and may overlap an entire area of each of the first openings OPE1, OPE2, and OPE3 of the pixel defining film in a plan view.

The first openings OPE1, OPE2, and OPE3 of the pixel defining film and the second openings OPRCL1, OPRCL2, and OPRCL3 of the reflection control layer may have planar shapes substantially identical or similar to each other, and as shown in the embodiment of FIG. 1, may have diamond shape with rounded corners or an oval shape in a plan view. According to an embodiment, the first openings OPE1, OPE2, and OPE3 of the pixel defining film 380 and the second openings OPRCL1, OPRCL2, and OPRCL3 of the reflective control layer RCL may have circular or polygonal shapes with rounded corner in a plan view.

In FIG. 1, the first openings OPE1, OPE2, and OPE3 of the pixel defining film may correspond to a light emitting region in which light is emitted from a light emitting device (or a light emitting element) (see, e.g., Anode, EML, Cathode, and FL of FIG. 2) corresponding to a region where a light emitting layer (see, e.g., EML of FIG. 2) of the light emitting device is disposed. Each of the first openings OPE1, OPE2, and OPE3 of the pixel defining film may correspond to light emitting regions emitting red, green, or blue light, and color of light emitted from each light emitting region may be different depending on a type of the light emitting layer described below. For example, the pixel defining film 380 may include first openings OPE1, second first openings OPE2, and third first openings OPE3. For example, the first opening OPE1 may emit first light (for example, red light), the second first opening OPE2 may emit second light (for example, green light), and the third first opening OPE3 may emit third light (for example, blue light).

Figure 2:
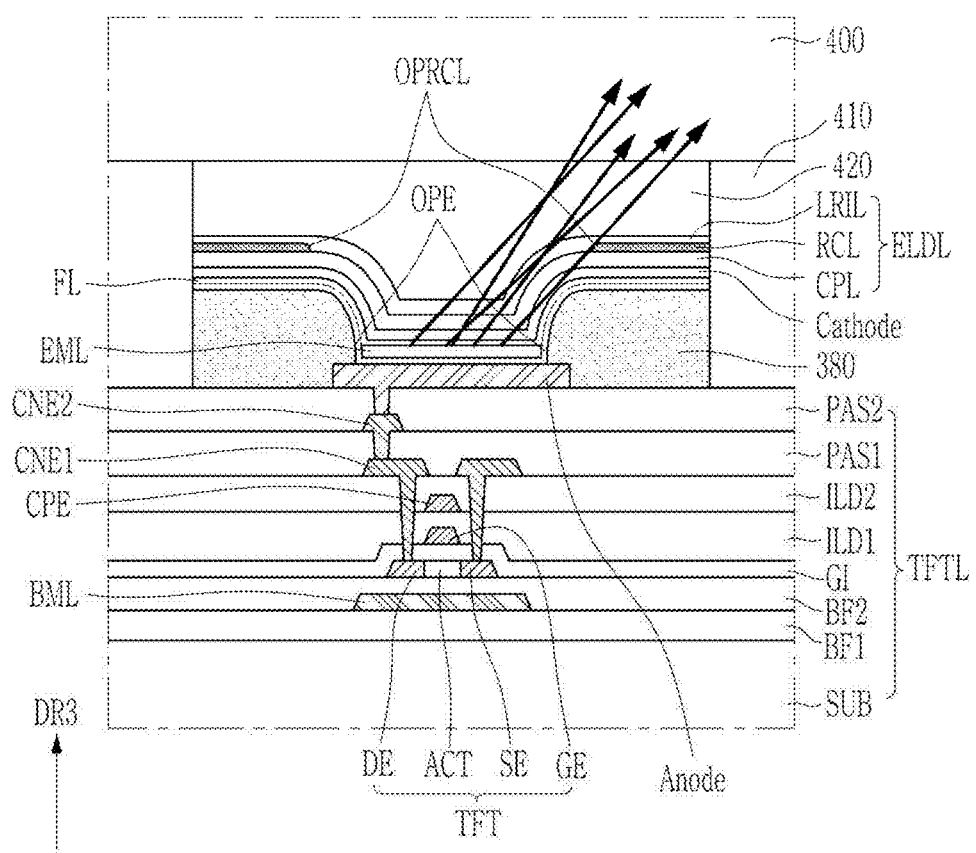
FIG. 2 is a schematic cross-sectional view of a portion of the light emitting display device according to the embodiment of FIG. 1.

On the other hand, in FIG. 1, each of the second openings OPRCL1, OPRCL2, and OPRCL3 of the reflection control layer may be disposed on an upper side of each of the first openings OPE1, OPE2, and OPE3 of the pixel defining film corresponding to the light emitting region in the third direction DR3, and may be formed wider than each of the first openings OPE1, OPE2, and OPE3 of the pixel defining film so that light emitted from the light emitting region also travels to a side surface as shown in FIG. 2.

In FIG. 1, a spacer SPC disposed above or on the pixel defining film is also shown. In an embodiment, the spacer SPC may be disposed on the pixel defining film and below the reflection control layer. According to another embodiment, the spacer SPC may be disposed above or on the reflection control layer, or may be omitted. Although a planar shape of the spacer SPC of FIG. 1 is illustrated as a quadrangular shape, the disclosure is not limited thereto, and the planar shape of the spacer SPC may have other planar shapes such as a circular shape, an elliptical shape, a polygonal shape, and the like in a plan view.

According to an embodiment, the spacer SPC shown in FIG. 1 may be a spacer formed with a high height, or may be formed with a low height over most regions of the pixel defining film.

As shown in FIG. 1, the first openings OPE1, OPE2, and OPE3 of the pixel defining film may be arranged in a first direction DR1 (intersecting the third direction DR3) and a second direction DR2 (intersecting the first direction DR1 and the third direction DR3). For example, as shown in the embodiment of FIG. 1, the second first openings OPE2 of the pixel defining film corresponding to green light emitting regions may be arranged in the first and second directions DR1 and DR2, and each of the first openings and the third first openings OPE1 and OPE3 of the pixel defining film corresponding to red emitting regions and blue emitting regions may also be arranged in the first and second directions DR1 and DR2. In the light emitting display device according to the embodiment of FIG. 1, the number of green light emitting regions may be twice as much as the number of red light emitting regions or blue light emitting regions, and the number of green light emitting regions may be equal to a sum of the number of red light emitting regions and the number of blue light emitting regions in a unit area. An arrangement of the first openings OPE1, OPE2, and OPE3 of the pixel defining film may vary according to an embodiment.

Each of the first openings OPE1, OPE2, and OPE3 of the pixel defining film corresponding to the light emitting region may overlap each of the second openings OPRCL1, OPRCL2, and OPRCL3 of the reflection control layer in a plan view. The reflection control layer may reduce reflection in case that external light is incident, and may adjust a color of a reflected light so that the reflected light is visually recognized as white mixed light. Thus, the reflection control layer may be formed of a material (e.g., Bi, Yb, or the like) having an absorption coefficient of greater than or equal to about 1.5 as shown in FIG. 4 and may be thermally deposited.

Hereinafter, a cross-sectional structure of the light emitting display device will be described with reference to FIG. 2.

FIG. 2 is a schematic cross-sectional view of a portion of the light emitting display device according to the embodiment of FIG. 1.

The light emitting display device of FIG. 2 may include a lower display panel including a lower substrate (or a substrate) SUB and an encapsulation substrate 400 facing the lower display panel and attached by a sealant 410 including a frit. The lower display panel of the light emitting display device may include a driving element layer (or a driving device layer) TFTL, a light emitting element layer EDL, and an external light decreasing layer ELDL, and the external light decreasing layer ELDL may include the reflection control layer RCL and a low-reflection inorganic layer LRIL. In an embodiment, the external light decreasing layer ELDL may also include a capping layer CPL.

A detailed structure (or the cross-sectional structure) of the lower display panel will be described below.

The substrate SUB may be a base substrate or a base member. The substrate SUB may be a flexible substrate that is bendable, foldable, or rollable. For example, the substrate SUB may include a polymer resin including polyimide (PI) or the like, but the disclosure is not limited thereto. In another embodiment, the substrate SUB may include a glass, a metal, or the like.

The driving element layer TFTL may include a first buffer layer BF1, a lower metal layer BML, a second buffer layer BF2, a transistor TFT, a gate insulating layer GI, a first interlayer insulating layer ILD1, a capacitor electrode CPE, a second interlayer insulating layer ILD2, a first connection electrode CNE1, a first passivation layer (or a first protective layer) PAS1, a second connection electrode CNE2, and a second passivation layer PAS2.

The first buffer layer BF1 may be disposed on the substrate SUB. The first buffer layer BF1 may include an inorganic film preventing penetration of air or moisture. For example, the first buffer layer BF1 may include multiple inorganic films alternately stacked each other. According to an embodiment, the first buffer layer BF1 may be omitted.

The lower metal layer BML may be disposed on the first buffer layer BF1. For example, the lower metal layer BML may be formed of a single layer or a multilayer formed of at least one of molybdenum (Mo), aluminum (Al), chromium (Cr), gold (Au), titanium (Ti), nickel (Ni), neodymium (Nd), and copper (Cu), or an alloy thereof.

The second buffer layer BF2 may cover the first buffer layer BF1 and the lower metal layer BML. The second buffer layer BF2 may include an inorganic film preventing penetration of air or moisture. For example, the second buffer layer BF2 may include multiple inorganic films alternately stacked each other.

The transistor TFT may be disposed on the second buffer layer BF2, and the transistor TFT may be a driving transistor or a switching transistor of a pixel circuit. The transistor TFT may include a semiconductor layer ACT, a source electrode SE, a drain electrode DE, and a gate electrode GE.

The semiconductor layer ACT may be disposed on the second buffer layer BF2. The semiconductor layer ACT may overlap the lower metal layer BML and the gate electrode GE in a thickness direction (e.g., the third direction DR3), and may be insulated from the gate electrode GE by the gate insulating layer GI. A portion of the semiconductor layer ACT may be made conductive by a material of the semiconductor layer ACT to form the source electrode SE and the drain electrode DE. The semiconductor layer ACT may be disposed between the source electrode SE and the drain electrode DE, and may be an undoped channel layer.

The gate electrode GE may be disposed on the gate insulating layer GI. The gate electrode GE may overlap the semiconductor layer ACT with the gate insulating layer GI interposed between the semiconductor layer ACT and the gate electrode GE in a thickness direction.

The gate insulating layer GI may be disposed on the semiconductor layer ACT. For example, the gate insulating layer GI may cover the semiconductor layer ACT and the second buffer layer BF2, and may insulate the semiconductor layer ACT from the gate electrode GE. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and a contact hole of the second interlayer insulating layer ILD2.

The capacitor electrode CPE may be disposed on the first interlayer insulating layer ILD1. The capacitor electrode CPE may overlap the gate electrode GE in a thickness direction. The capacitor electrode CPE and the gate electrode GE may form a capacitor.

The second interlayer insulating layer ILD2 may cover the capacitor electrode CPE and the first interlayer insulating layer ILD1. The second interlayer insulating layer ILD2 may include the contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the transistor TFT and the second connection electrode CNE2. The first connection electrode CNE1 may be formed in the contact holes formed on the second interlayer insulating layer ILD2, the first interlayer insulating layer ILD1, and the gate insulating layer GI and contact the drain electrode DE of the transistor TFT.

The first passivation layer PAS1 may cover the first connection electrode CNE1 and the second interlayer insulating layer ILD2. The first passivation layer PAS1 may protect the transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 and an anode (hereinafter also referred to as a first electrode) Anode of the light emitting device. The second connection electrode CNE2 may be formed in the contact hole formed on the first passivation layer PAS1 and contact the first connection electrode CNE1.

The second passivation layer PAS2 may cover the second connection electrode CNE2 and the first passivation layer PAS1. The second passivation layer PAS2 may include a contact hole through which the anode Anode of the light emitting device passes.

The light emitting element layer EDL may be disposed above or on the second passivation layer PAS2 of the driving element layer TFTL. The light emitting element layer EDL may include the light emitting device and the pixel defining film 380. The light emitting device may include the anode Anode, a light emitting layer (or an emission layer) EML, and a cathode (hereinafter also referred to as a second electrode) Cathode. The light emitting device may further include a functional layer FL disposed at both sides of the light emitting layer EML, and the functional layer FL may include at least one layer of a hole injection layer, a hole transport layer, an electron injection layer, and an electron transport layer.

The anode Anode may be disposed on the second passivation layer PAS2. The anode Anode may be disposed to overlap one of the first openings OPE1, OPE2, and OPE3 of the pixel defining film 380 in a plan view. The anode Anode may be electrically connected to the drain electrode DE of the transistor TFT through the first and second connection electrodes CNE1 and CNE2.

The light emitting layer EML may be disposed above the anode Anode. For example, the light emitting layer EML may be an organic light emitting layer made of an organic material, but the disclosure is not limited thereto. The functional layer FL may be disposed at both sides of the light emitting layer EML, the functional layer FL disposed between the light emitting layer EML and the anode Anode may include the hole injection layer and/or the hole transport layer, and the functional layer FL disposed between the light emitting layer EML and the cathode Cathode may include the electron transport layer and/or the electron injection layer. In case that the transistor TFT applies a voltage (e.g., a predetermined or selectable voltage) to the anode Anode of the light emitting device and the cathode Cathode of the light emitting device receives a common voltage or a low driving voltage in a light emitting layer EML corresponding to an organic light emitting layer, a hole and an electron respectively may move to the light emitting layer EML through the hole transport layer and the electron transport layer so that an electric current flows in the light emitting device, and the hole and the electron may be combined with each other in the light emitting layer EML to emit light.

The cathode Cathode may be disposed above or on the light emitting layer EML and the functional layer FL. For example, the cathode Cathode may be an electrode common to all of multiple pixels. The cathode Cathode may be disposed above the light emitting layer EML at the first openings OPE1, OPE2, and OPE3, and may be disposed above the pixel defining film 380 in a region other than the first openings OPE1, OPE2, and OPE3. The functional layer FL may be disposed between the pixel defining film 380 and the cathode Cathode.

The cathode Cathode may receive the common voltage or the low driving voltage. In case that the anode Anode receives a voltage corresponding to a data voltage and the cathode Cathode receives the low driving voltage, a potential difference may be formed between the anode Anode and the cathode Cathode, and the light emitting layer EML may emit light as electric current flows.

The pixel defining film 380 may include multiple first openings OPE (e.g., the first openings OPE1, OPE2, and OPE3) and may be disposed on a portion of the second passivation layer PAS2 and a portion of the anode Anode. Referring to FIG. 1, the pixel defining film 380 may include first openings OPE1, second first openings OPE2, and third first openings OPE3, and each of the first openings OPE1, OPE2, and OPE3 may expose a portion of the anode Anode. As described above, each of the first openings OPE of the pixel defining film 380 may correspond to the light emitting region in which the light emitting device emits light, and each light emitting region may have a different area or size according to a color of light. The pixel defining film 380 may separate and insulate each anode Anode of multiple light emitting devices.

The pixel defining film 380 may be a black pixel defining film including a light absorbing material to prevent reflection of external light. For example, the pixel defining film 380 may include a polyimide (PI)-based binder and a pigment in which red, green, and blue colors are mixed. In another embodiment, the pixel defining film 380 may include a cardo-based binder resin and a mixture of a lactam-based black pigment and a blue pigment. In another embodiment, the pixel defining film 380 may include carbon black or the like.

A polarizing plate may not be formed on a front surface (e.g., an entire surface) of the light emitting display device, and instead, the pixel defining film 380 may be formed as the black pixel defining film that prevents reflection of external light, so that even if the external light is incident to an inside, an amount of light that is reflected back and transmitted to a user may be reduced.

The spacer (see, e.g., SPC of FIG. 1) may be disposed on an upper surface of the pixel defining film 380. The spacer may be disposed above the pixel defining film 380 and below the functional layer FL and the cathode Cathode. According to an embodiment, the spacer may be divided into a low height spacer and a high height spacer, the low height spacer may be disposed on most of the pixel defining film 380, and the high height spacer may be disposed only on a portion of the pixel defining film 380. In case that the spacers have different heights, the spacer SPC of FIG. 1 may show only the spacers having a high height.

The external light decreasing layer ELDL may be disposed on the cathode Cathode and may include a capping layer CPL, the reflection control layer RCL, and the low-reflection inorganic layer LRIL.

The capping layer CPL may cover an entire surface of the cathode Cathode, protect the light emitting device, and efficiently transmit light generated from the light emitting layer EML to an outside.

In the embodiment of FIG. 2, the reflection control layer RCL having a second opening OPRCL (e.g., one of the second openings OPRCL1, OPRCL2, and OPRCL3) may be disposed on the capping layer CPL. The second opening OPRCL of the reflection control layer RCL may be formed wider than the first opening OPE of the pixel defining film 380 so that the second opening OPPRCL of the reflection control layer RCL overlaps the first opening OPE of the pixel defining film 380 and a portion of the pixel defining film 380 in a plan view.

The reflection control layer RCL may be a layer that adjusts reflectance and/or reflective color in case that external light is reflected after the external light is incident, and may be formed of an inorganic material having an absorption coefficient (k) of greater than or equal to about 1.5 and may be thermally deposited. The inorganic material forming the reflection control layer RCL may include bismuth (Bi), ytterbium (Yb), or the like, and materials constituting the reflection control layer RCL will be described in detail in FIG. 4.

In the embodiment of FIG. 2, the low-reflection inorganic layer LRIL may be disposed on the reflection control layer RCL and the capping layer CPL. The low-reflection inorganic layer LRIL may be a layer that reduces reflectance of external light, and may include an inorganic material having low reflectance. The low-reflection inorganic layer LRIL may overlap the first opening OPE of the pixel defining film 380 in a plan view corresponding to the light emitting region and may be also disposed above the light emitting layer EML. Because transmittance of light emitted from the light emitting layer EML has to be also considered in the low-reflection inorganic layer LRIL, there is a limit to reduce a degree of external light reflected from an upper surface of the pixel defining film 380. According to an embodiment, the reflection control layer RCL may be disposed only above the upper surface of the pixel defining film 380 so that a degree (reflectance) of external light reflected from the pixel defining film 380 may be reduced and reflective color may be adjusted.

The lower display panel as described above may be attached to the encapsulation substrate 400 by a sealant 410 including a frit. A filling layer 420 may be disposed between the lower display panel, the encapsulation substrate 400, and the sealant 410 (or between each of the sealants 410).

The encapsulation substrate 400 may be disposed above the external light decreasing layer ELDL in the third direction DR3. The encapsulation substrate 400 may include glass or the like, and the encapsulation substrate 400 may have a rigid property. The encapsulation substrate 400 may protect the light emitting layer EML from foreign substances such as moisture, oxygen, a dust particle, or the like. The filling layer 420 may be disposed between the encapsulation substrate 400 and the external light decreasing layer ELDL of the lower display panel. The filling layer 420 may be disposed at a space between the encapsulation substrate 400 and the external light decreasing layer ELDL, and may include an inert gas. The filling layer 420 may prevent a foreign substance present between the external light decreasing layer ELDL and the encapsulation substrate 400 from being diffused.

The sealant 410 may be disposed along outer circumference of the encapsulation substrate 400 prior to adhesion of the encapsulation substrate 400. The sealant 410 may include a frit or the like. However, a material constituting the sealant 410 is not limited thereto.

In the embodiment, a polarizing plate may not be attached to a side of the encapsulation substrate 400. For example, the polarizing plate may serve to prevent display quality from deteriorating by preventing the user from visually perceiving external light incident and reflected from the anode Anode or the like. However, in the embodiment, a side surface of the anode Anode may be covered with the pixel defining film 380 (for example, the black pixel defining film) to reduce a degree of reflection from the anode Anode, and the external light decreasing layer ELDL including the reflection control layer RCL and the low-reflection inorganic layer LRIL may have a structure that reduces a degree of reflection of external light and prevents deterioration of display quality due to the reflection. Therefore, it is not necessary to separately form the polarizing plate at on front surface (e.g., an entire surface) of the light emitting display device.

Hereinafter, a stacking sequence of the pixel defining film 380, the reflection control layer RCL, and the low-reflection inorganic layer LRIL that reduce the reflection of external light, will be schematically described with reference to FIG. 3.

Figure 3:
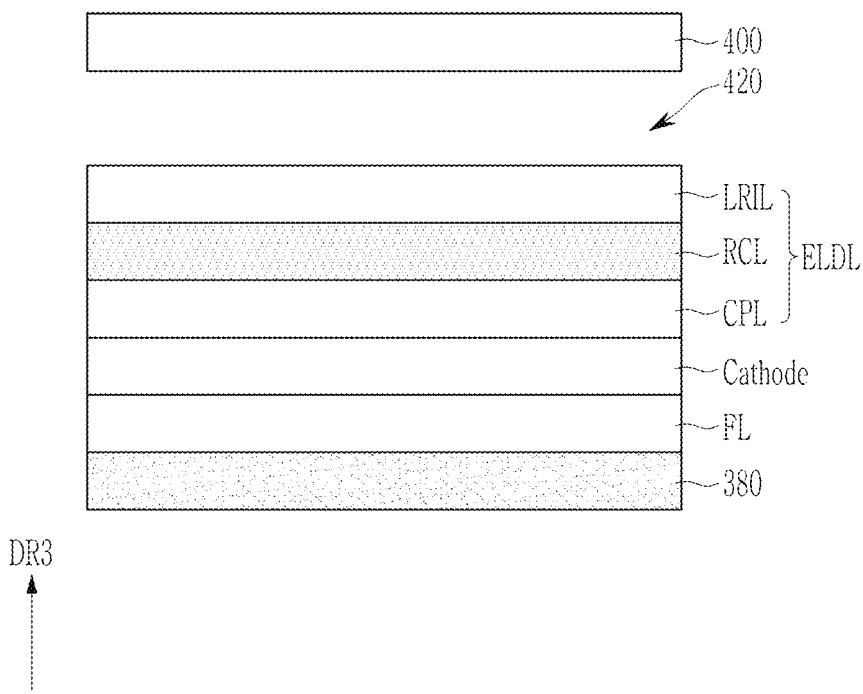
FIG. 3 is a schematic enlarged cross-sectional view of a portion of the light emitting display device according to the embodiment of FIG. 1.

FIG. 3 is a schematic enlarged cross-sectional view of a portion of the light emitting display device according to the embodiment of FIG. 1.

In FIG. 3, the low-reflection inorganic layer LRIL, the reflection control layer RCL, and the capping layer CPL may constitute the external light decreasing layer ELDL, and the cathode Cathode, the functional layer FL, and the pixel defining film 380 may be layers of the light emitting element layer EDL.

FIG. 3 schematically illustrates a stacking relationship of portions where the first and second openings OPE and OPRCL are not disposed, and the functional layer FL, the cathode Cathode, the capping layer CPL, the reflection control layer RCL, and the low-reflection inorganic layer LRIL may be sequentially stacked on the pixel defining film 380. The filling layer 420 may be disposed on the low-reflection inorganic layer LRIL, and the encapsulation substrate 400 may be disposed on the filling layer 420.

In case that external light is incident on the encapsulation substrate 400, the external light may pass through the filling layer 420 to be incident on the low-reflection inorganic layer LRIL and the reflection control layer RCL. Reflectance of the external light may be reduced or partially absorbed by the low-reflection inorganic layer LRIL and the reflection control layer RCL, and the reflectance of the external light may be reduced.

The low-reflection inorganic layer LRIL may include an inorganic material having low reflectance. The low-reflection inorganic layer LRIL may include ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), the like, or a combination thereof. The low-reflection inorganic layer LRIL may be formed by thermally depositing the inorganic material. The inorganic material included in the low-reflection inorganic layer LRIL may have an absorption coefficient (k) of greater than or equal to about 0.5 and a refractive index of greater than or equal to about 1. For example, the low-reflection inorganic layer LRIL may have a thickness in a range of about 0.1 nm to about 50 nm. For example, the low-reflection inorganic layer LRIL may have a thickness in a range of about 0.5 nm to about 30 nm. For example, the low-reflection inorganic layer LRIL may have a thickness in a range of about 1 nm to about 20 nm. Referring to FIG. 2, the low-reflection inorganic layer LRIL may overlap the first opening OPE of the pixel defining film 380 in a plan view corresponding to the light emitting region and may be also disposed above the light emitting layer EML. Since transmittance of light emitted from the light emitting layer EML has to be considered in the low-reflection inorganic layer LRIL, there is a limit to reduce a degree of external light reflected from an upper surface of the pixel defining film 380. According to an embodiment, the reflection control layer RCL may be disposed only above the upper surface of the pixel defining film 380.

The reflection control layer RCL may be a layer that adjusts reflectance and/or reflective color in case that external light is reflected after the external light is incident, and may be formed of an inorganic material having an absorption coefficient (k) of greater than or equal to about 1.5 and may be thermally deposited. The inorganic material forming the reflection control layer RCL may include bismuth (Bi), ytterbium (Yb), or the like, and the inorganic material forming the reflection control layer RCL will be described in detail in FIG. 4.

FIG. 4 is a table listing materials usable for the reflection control layer of the light emitting display device according to an embodiment.

Referring to FIG. 4, the reflection control layer RCL may include bismuth (Bi), ytterbium (Yb), magnesium (Mg), calcium (Ca), manganese (Mn), tin (Sn), zinc (Zn), indium (In), the like, or a combination thereof. The reflection control layer RCL may be formed by thermally depositing the inorganic material. The inorganic material included in the reflection control layer RCL may have an absorption coefficient (k) of greater than or equal to about 1.5 and a refractive index of greater than or equal to about 1. The absorption coefficient (k) may be a value according to an inherent characteristic of a material, be a constant value representing a degree to which an amount of light decreases in case that the light passes through a certain material, and correspond to k in Equation 1 below.

$$I_t = I_i e^{-kd}$$ [Equation 1]

$I_t$ may be an intensity of light transmitted to be emitted, $I_i$ may be an intensity of incident light, k may be an absorption coefficient, and d may be a thickness of a layer including a material.

Using the intensity ($I_i$) of incident light and the intensity ($I_t$) of light transmitted to be emitted, transmittance (T) may be calculated as shown in Equation 2 below.

$$T = I_t/I_i$$ [Equation 2]

Using Equations 1 and 2, the absorption coefficient (k) may be obtained through Equation 3.

$$k = -(\ln T)/d$$ [Equation 3]

According to Equation 3, the absorption coefficient (k) may be obtained only if the thickness (d) and the transmittance (T) of the layer including the material can be obtained. Therefore, the absorption coefficient (k) may be calculated by an equipment such as a UV-Visible spectrometer CM-3700A, or the like measuring the transmittance (T).

In FIG. 4, a temperature (T1) (Kelvin temperature (K)) of each inorganic material based on a vapor pressure of about 1 Pa is listed along with the absorption coefficient (k) of each material. It may be seen that each of the inorganic materials listed in FIG. 4 is a material that may be sufficiently thermally deposited in consideration of pressure and temperature.

On the other hand, a thickness of the reflection control layer RCL may be in a range of about 0.1 nm to about 50 nm. The reflection control layer RCL may be formed of a thickness minimizing reflectance of external light on the pixel defining film 380 in consideration of a thickness and reflectance of the low-reflection inorganic layer LRIL. Referring to FIG. 2, the reflection control layer RCL may have the second opening OPRCL and not formed above the first opening OPE of the pixel defining film 380 corresponding to the light emitting region, so that transmittance of light emitted from the light emitting layer EML through the reflection control layer RCL may not be considered, and the reflection control layer RCL may be a layer for adjusting a degree of reflection of the external light and reflective color of the external light from the pixel defining film 380.

The reflection control layer RCL and the low-reflection inorganic layer LRIL may be formed of a same inorganic material, and may be formed to have different thicknesses even in case that the reflection control layer RCL and the low-reflection inorganic layer LRIL include the same inorganic material. For example, both the reflection control layer RCL and the low-reflection inorganic layer LRIL may be formed of bismuth (Bi). However, since reflectance of external light may be relatively high in case that bismuth (Bi) is formed with a thickness in a range of about 15 nm to about 20 nm, the reflection control layer RCL and the low-reflection inorganic layer LRIL may be formed thicker or thinner so that thicknesses of the reflection control layer RCL and the low-reflection inorganic layer LRIL do not fall within a range of about 15 nm to about 20 nm. On the other hand, even in case that bismuth (Bi) is included in the reflection control layer RCL or the low-reflection inorganic layer LRIL, the bismuth (Bi) may be formed with a thickness outside a thickness range of about 15 nm to about 20 nm.

On the other hand, a decrease in reflectance of external light may occur in the pixel defining film 380 and the filling layer 420 as well as in the reflection control layer RCL and the low-reflection inorganic layer LRIL. For example, the pixel defining film 380 may be formed of a black pixel defining film that absorbs external light, and the filling layer 420 may reduce scattering reflection by reducing interfacial reflection by a difference in refractive index between an upper layer and a lower layer (for example, the encapsulation substrate 400) and the filling layer 420.

In the light emitting display device according to an embodiment, a decrease in scattering reflectance by the filling layer 420, the reflection control layer RCL, and the low-reflection inorganic layer LRIL layer may be described as follows.

The low-reflection inorganic layer LRIL may induce destructive interference to reduce the scattering reflectance from about 33% to about 15%, the filling layer 420 may reduce the interfacial reflection by the difference in refractive index to reduce the scattering reflectance from about 15% to about 10%, and the reflection control layer RCL may absorb external light to reduce the scattering reflectance from about 10% to less than or equal to about 5.9%.

As described above, even in case that the polarizing plate is not included in the light emitting display device, external light incident on the light emitting display device may be absorbed by the pixel defining film 380, the filling layer 420, the low reflection inorganic layer LRIL, and the reflection control layer RCL in the light emitting display device, so that reflectance of the external light may be reduced and display quality and visibility may be improved.

Hereinafter, a structure of a modified embodiment will be described with reference to FIGS. 5 to 8.

First, embodiments of FIGS. 5 to 7 will be described.

Figure 5:
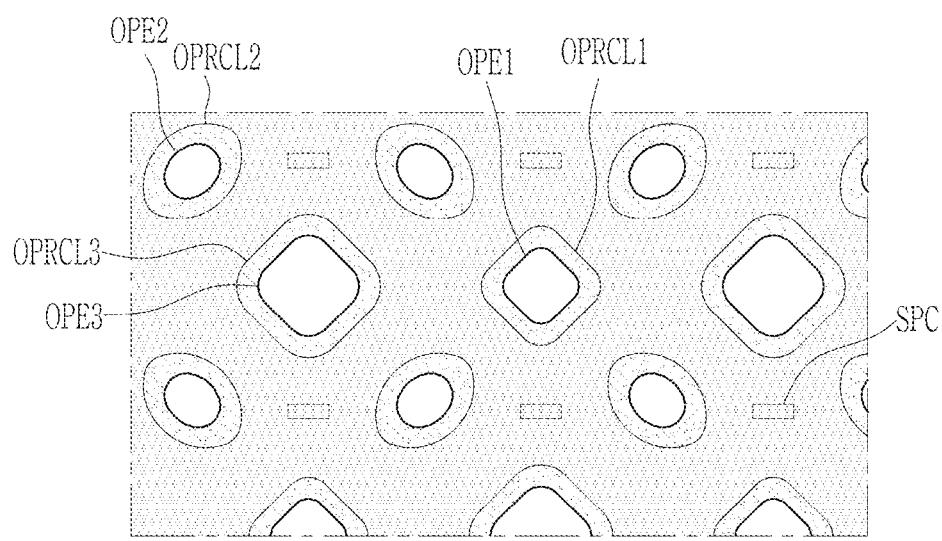
FIG. 5 is a schematic plan view of a portion of a light emitting display device according to another embodiment.
Figure 5:
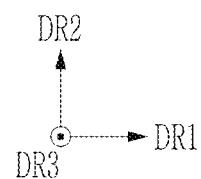
Figure 6:
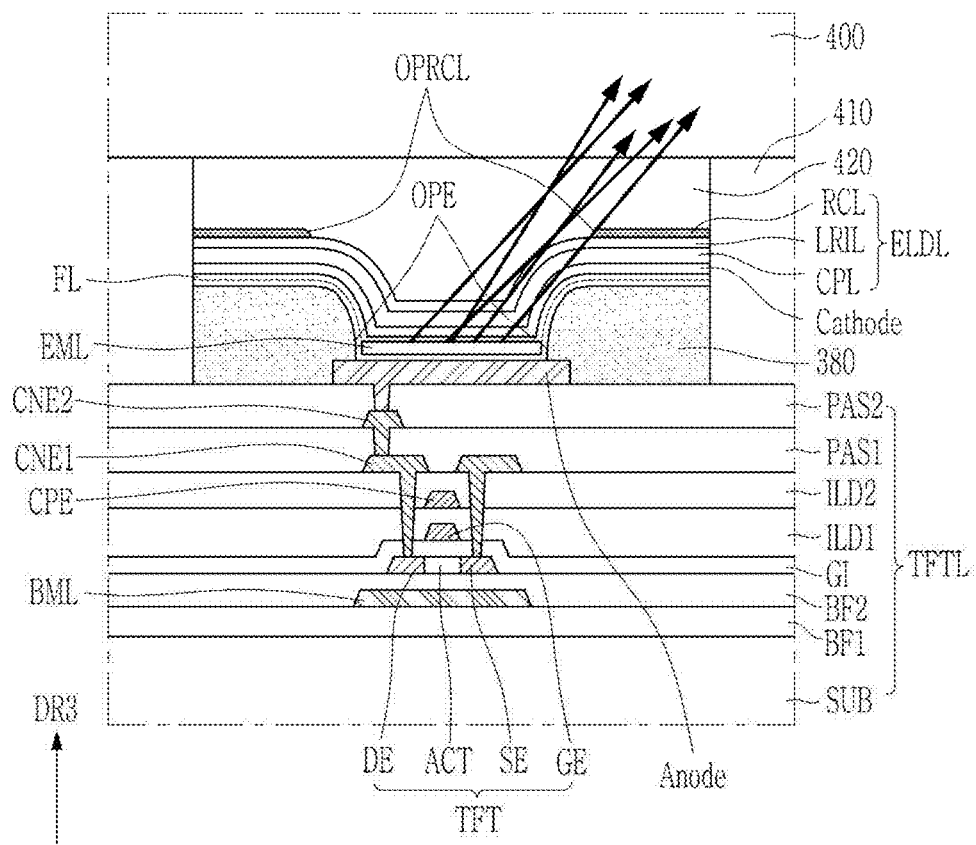
FIG. 6 is a schematic cross-sectional view of a portion of the light emitting display device according to the embodiment of FIG. 5.
Figure 7:
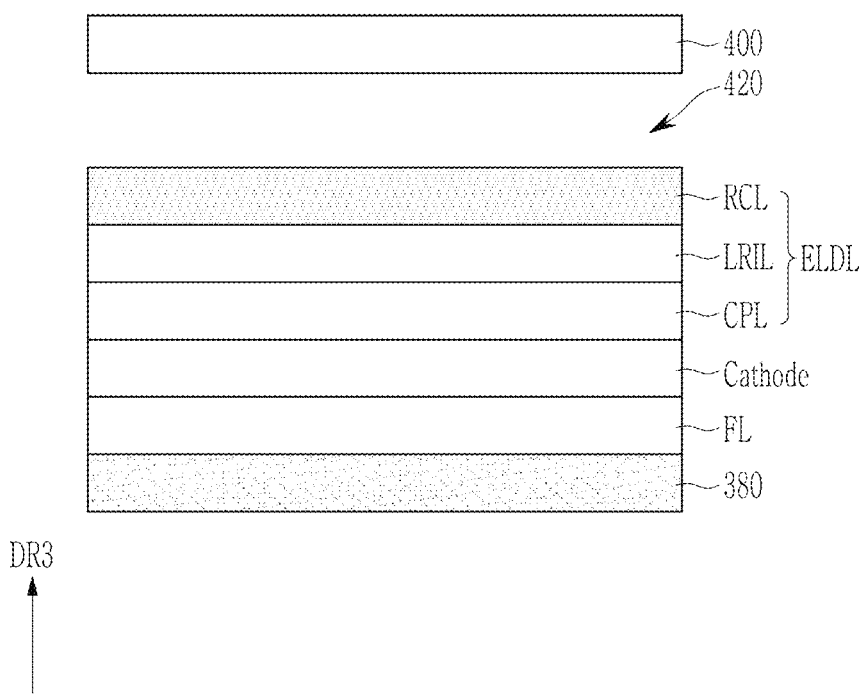
FIG. 7 is a schematic enlarged cross-sectional view of a portion of the light emitting display device according to the embodiment of FIG. 5.

FIG. 5 is a schematic plan view of a portion of a light emitting display device according to another embodiment, FIG. 6 is a schematic cross-sectional view of a portion of the light emitting display device according to the embodiment of FIG. 5, and FIG. 7 is a schematic enlarged cross-sectional view of a portion of the light emitting display device according to the embodiment of FIG. 5.

Unlike the embodiments of FIGS. 1 to 3, in the embodiments of FIGS. 5 to 7, the reflection control layer RCL may be disposed on the low reflection inorganic layer LRIL in the third direction DR3. Other arrangement may be the same. There is no difference between the planar structures of FIG. 5 and FIG. 1, and differences in a cross-sectional structure referring to FIGS. 6 and 7 will be described as follows.

The light emitting display device according to the embodiments of FIGS. 5 to 7 may include the lower display panel including the lower substrate SUB and the encapsulation substrate 400 facing the lower display panel and attached by the sealant 410 including a frit, the lower display panel may include the driving element layer (or the driving device layer) TFTL, the light emitting element layer EDL, and the external light decreasing layer ELDL, and the external light decreasing layer ELDL may include the reflection control layer RCL and the low-reflection inorganic layer LRIL, a structure of a remaining portion and a structure of a remaining portion (e.g., SUB, TFTL, EDL, and 400) of the embodiment of FIGS. 1 to 3 may be the same except for the external light decreasing layer ELDL, the external light decreasing layer ELDL according to the embodiments of FIGS. 5 to 7 may include the capping layer CPL, the reflection control layer RCL, and the low-reflection inorganic layer LRIL, the low-reflection inorganic layer LRIL may be disposed on the capping layer CPL in the third direction DR3, and the reflection control layer RCL may be disposed on the low-reflection inorganic layer LRIL in the third direction DR3.

Characteristics of the capping layer CPL, the low-reflection inorganic layer LRIL, and the reflection control layer RCL of FIGS. 5 to 7 and characteristics of the capping layer CPL, the low-reflection inorganic layer LRIL, and the reflection control layer RCL of the embodiment of FIGS. 1 to 3 may be the same, the reflection control layer RCL may be formed of an inorganic material having an absorption coefficient (k) of greater than or equal to about 1.5 and may be thermally deposited as listed in FIG. 4, and the low-reflection inorganic layer LRIL may be formed by thermal deposition of an inorganic material having an absorption coefficient (k) of greater than or equal to about 0.5 and a low reflectance.

The light emitting display device according to the embodiments of FIGS. 5 to 7 may also not include the polarizing plate, and reflectance of external light may be reduced by the pixel defining film 380 and the filling layer 420 (in addition to the reflection control layer RCL and the low-reflection inorganic layer LRIL) in the light emitting display device. For example, the filling layer 420 may reduce scattering reflection by reducing interfacial reflection by a difference in refractive index between an upper layer and a lower layer (for example, the encapsulation substrate 400) and the filling layer 420, and the pixel defining film 380 may be formed of a black pixel defining film to absorb the external light.

As described above, even in case that the polarizing plate is not included in the light emitting display device, the external light incident on the light emitting display device may be absorbed by the pixel defining film 380, the filling layer 420, the low reflection inorganic layer LRIL, and the reflection control layer RCL in the light emitting display device, and reflectance of the external light may be reduced and display quality and visibility may be improved.

Figure 8:
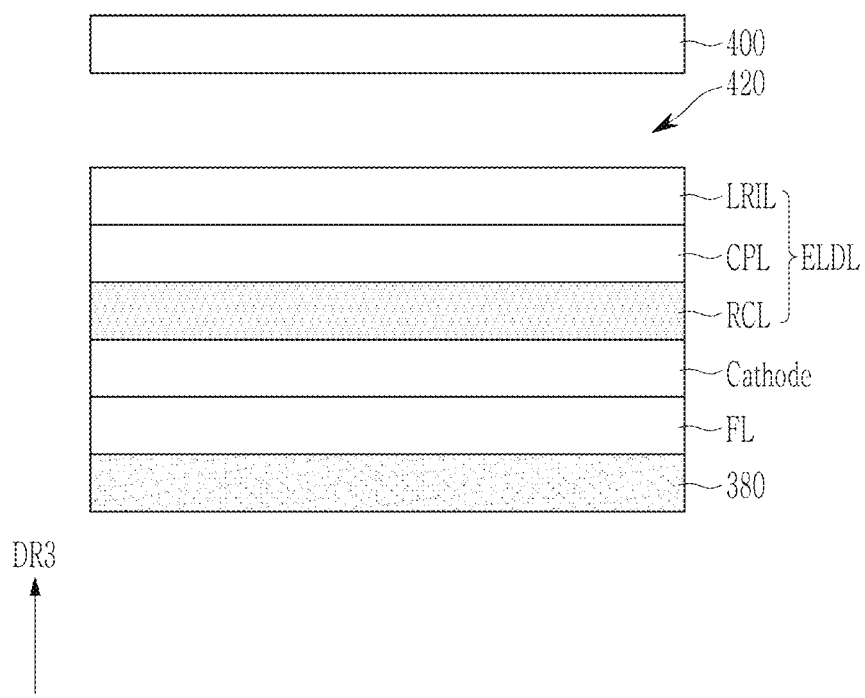
FIG. 8 is a schematic enlarged cross-sectional view of a portion of a light emitting display device according to another embodiment of FIG. 5.

FIG. 8 schematically illustrates a light emitting display device having another stacked structure.

FIG. 8 is a schematic enlarged cross-sectional view of a portion of the light emitting display device according to another embodiment.

FIG. 8 is a schematic view corresponding to FIGS. 3 and 7. Unlike the embodiments of FIGS. 1 to 3 and the embodiments of FIGS. 5 to 7, the reflection control layer RCL may be disposed below the low-reflection inorganic layer LRIL and the capping layer CPL in a direction opposite to the third direction DR3 in FIG. 8. Other stacking relationships may be the same.

The light emitting display device according to the embodiments of FIG. 8 may include the lower display panel including the lower substrate SUB and the encapsulation substrate 400 facing the lower display panel and attached by a sealant 410 including a frit, the lower display panel may include the driving element layer (or the driving device layer) TFTL, the light emitting element layer EDL, and the external light decreasing layer ELDL, and the external light decreasing layer ELDL may include the reflection control layer RCL and the low-reflection inorganic layer LRIL, a structure of a remaining portion except for the external light decreasing layer ELDL and a structure of a remaining portion (e.g., SUB, TFTL, EDL, and 400) of the embodiment of FIGS. 1 to 3 and the embodiments of FIGS. 5 to 7 may be the same, the external light decreasing layer ELDL according to the embodiment of FIG. 8 may include the capping layer CPL, the reflection control layer RCL, and the low-reflection inorganic layer LRIL, the capping layer CPL may be disposed in a direction opposite to the third direction DR3 on the low-reflection inorganic layer LRIL, and the reflection control layer RCL may be disposed in a direction opposite to the third direction DR3 on the capping layer CPL.

Characteristics of the capping layer CPL, the low-reflection inorganic layer LRIL, and the reflection control layer RCL of FIG. 8 and characteristics of the capping layer CPL, the low-reflection inorganic layer LRIL, and the reflection control layer RCL of the embodiment of FIGS. 1 to 3 and the embodiment of FIGS. 5 to 7 may be the same, the reflection control layer RCL may be formed of an inorganic material having an absorption coefficient (k) of greater than or equal to about 1.5 and may be thermally deposited as listed in FIG. 4, and the low-reflection inorganic layer LRIL may be formed by thermal deposition of an inorganic material having an absorption coefficient (k) of greater than or equal to about 0.5 and a low reflectance.

The light emitting display device according to the embodiment of FIG. 8 may not include the polarizing plate, and reflectance of external light may be reduced by the pixel defining film 380 and the filling layer 420 (in addition to the reflection control layer RCL and the low-reflection inorganic layer LRIL) in the light emitting display device. For example, the filling layer 420 may reduce scattering reflection by reducing interfacial reflection by a difference in refractive index between an upper layer and a lower layer (for example, the encapsulation substrate 400) and the filling layer 420, and the pixel defining film 380 may be formed of a black pixel defining film to absorb the external light.

As described above, even in case that the polarizing plate is not included in the light emitting display device, the external light incident on the light emitting display device may be absorbed by the pixel defining film 380, the filling layer 420, the low reflection inorganic layer LRIL, and the reflection control layer RCL in the light emitting display device, so that reflectance of the external light may be reduced and display quality and visibility may be improved.

A structure of a comparative embodiment will be described with reference to FIGS. 9 to 11, and a difference between the comparative embodiment and the embodiment will be compared and described with reference to FIGS. 12 to 14.

First, a structure of the comparative embodiment will be described with reference to FIGS. 9 to 11.

Figure 9:
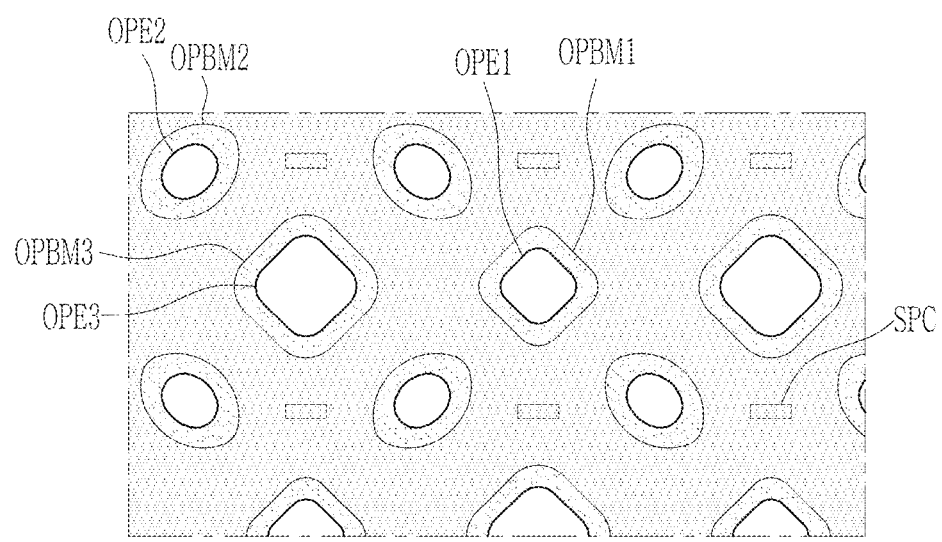
FIG. 9 is a schematic plan view of a portion of a light emitting display device according to a comparative embodiment.
Figure 10:
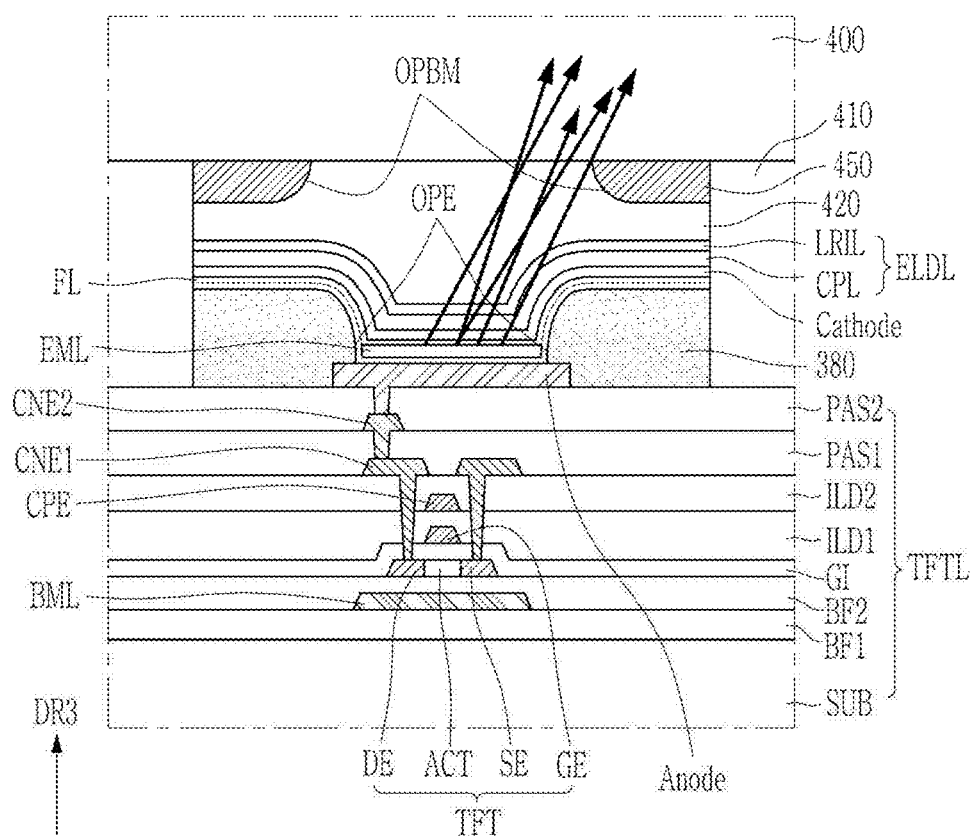
FIG. 10 is a schematic cross-sectional view of the light emitting display device according to the comparative embodiment.
Figure 11:
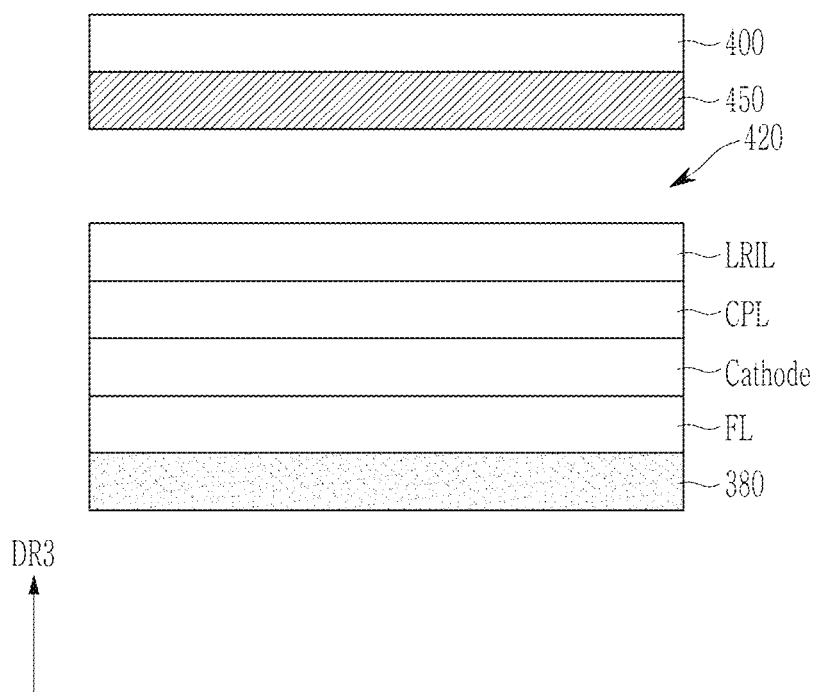
FIG. 11 is a schematic enlarged cross-sectional view of a portion of the light emitting display device according to the comparative embodiment.

FIG. 9 is a schematic plan view of a portion of a light emitting display device according to the comparative embodiment, FIG. 10 is a schematic cross-sectional view of the light emitting display device according to the comparative embodiment, and FIG. 11 is a schematic enlarged cross-sectional view of a portion of the light emitting display device according to the comparative embodiment.

In the comparative embodiment, the low reflection inorganic layer LRIL may be included, and a reflection control layer RCL may be not formed, and a light blocking layer 450 may be formed at a lower side (for example, a surface opposite to the third direction DR3) of the encapsulation substrate 400.

Referring to FIG. 9, the light blocking layer 450 may include openings OPBM1, OPBM2, and OPBM3, and an area occupied by the openings OPBM1, OPBM2, and OPBM3 of the light blocking layer 450 and an area occupied by the second openings OPRCL1. OPRCL2, and OPRCL3 of the reflection control layer RCL of the embodiment may be the same in a plan view.

Referring to FIG. 10, since an opening OPBM (e.g., each of the openings OPBM1, OPBM2, and OPBM3) of the light blocking layer 450 is disposed on the encapsulation substrate 400, an angle of light emitted from a light emitting layer EML corresponding to a light emitting region transmitted to a side surface may be reduced. For example, comparing an arrow shown in FIG. 2 or 6 with an arrow shown in FIG. 10, it may be seen that an angle of an arrow indicating a direction of light emitted from the light emitting layer EML has an angle closer to the third direction DR3 in FIG. 10 since the light blocking layer 450 is disposed on the encapsulation substrate 400. Therefore, visibility from the side surface may be reduced in the comparative embodiment.

FIG. 11 is a schematic view illustrating a stacking relationship of FIG. 10 corresponding to FIG. 3, 7, or 8.

In the light emitting display device according to the comparative embodiment, the polarizing plate may also not be formed (or included), and reflectance of external light may be reduced by the light blocking layer 450, and visibility from the side surface may be reduced.

However, it may be confirmed that visibility from a side surface is also improved in the embodiment.

Hereinafter, a difference between the comparative embodiment and the embodiment will be compared and described with reference to FIGS. 12 to 14.

First, reflectance and color change of a color coordinate will be described with reference to FIGS. 12 and 13.

Figure 13:
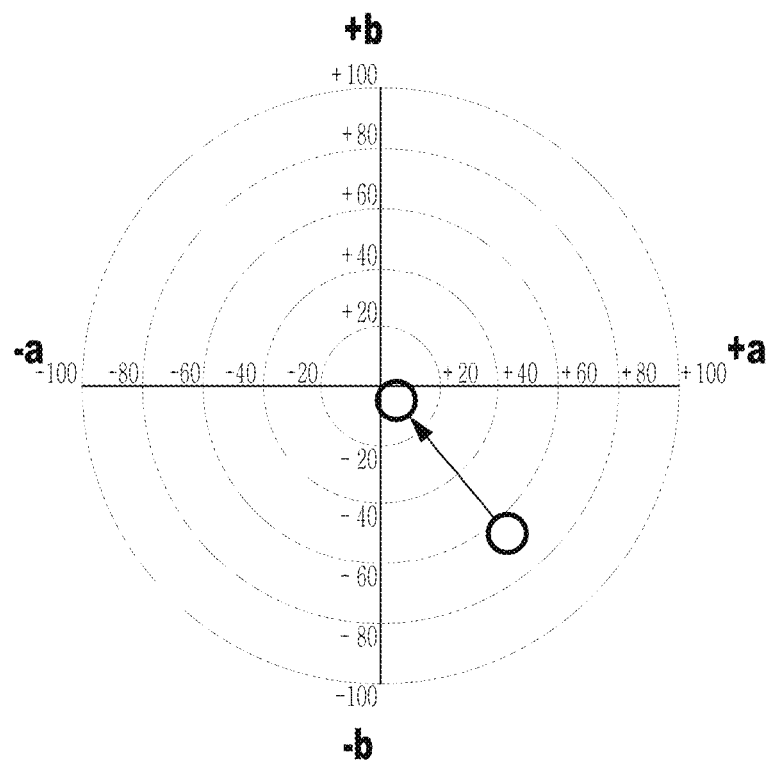
FIG. 13 is a schematic view showing comparison of a characteristic of a color coordinate between the comparative embodiment and the embodiment.

FIG. 12 is a table comparing a characteristic between the comparative embodiment and the embodiment, and FIG. 13 is a schematic view showing comparison of a characteristic of the color coordinate between the comparative embodiment and the embodiment.

In FIG. 12, reflectance SCI, reflectance SCE, and color coordinate values a* and b* of the comparative embodiment and the embodiment are described, and FIG. 13 shows a change of coordinate values in the comparative embodiment and the embodiment in the color coordinate.

First, referring to FIG. 12, two reflectances SCI and SCE are described, the reflectance SCI may be total reflectance including the scattering reflectance and mirror reflectance, and the reflectance SCE may be the scattering reflectance because of scattering reflection.

It may be seen that the comparative embodiment has a higher total reflectance SCI than the embodiment but has a lower scattering reflectance SCE than the embodiment in FIG. 12. The comparative embodiment and the embodiment do not have a large difference in the scattering reflectance SCE, but there is a relatively large difference in the total reflectance SCI, so that it may be confirmed that degradation of display quality due to reflection of external light occurs less in the embodiment overall.

Referring to FIG. 12, it may be seen that the color coordinate value is biased to a side in the comparative embodiment compared to the embodiment and the color coordinate value is relatively less biased in the embodiment. As a result, it may be seen that as shown by an arrow in FIG. 13, white balance due to reflected light is also matched in the embodiment compared to the comparative embodiment and deterioration in color due to the reflected light may be prevented.

Hereinafter, another difference between the comparative embodiment and the embodiment that may occur in case that the encapsulation substrate 400 is attached will be described with reference to FIGS. 14A, 14B, and 14C.

Figure 14A:
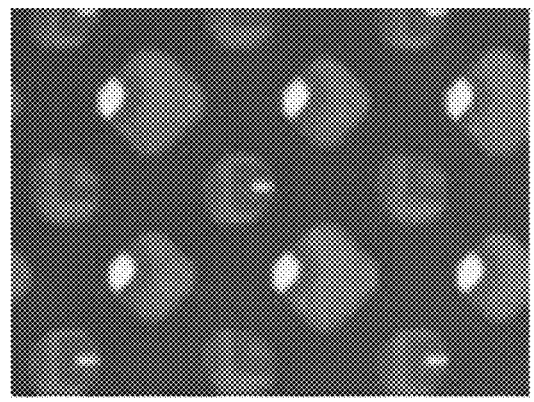
FIGS. 14A, 14B, and 14C are schematic views each illustrating a misalignment problem occurring in the comparative embodiment.
Figure 14B:
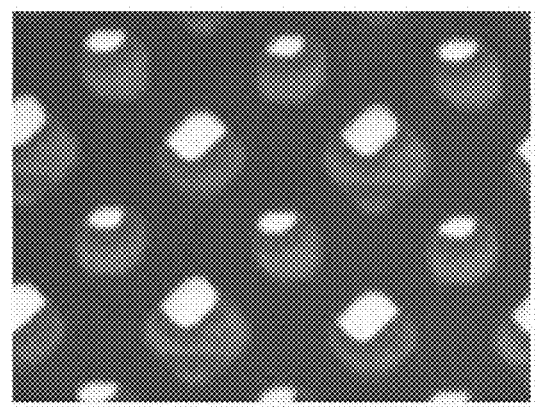
Figure 14C:
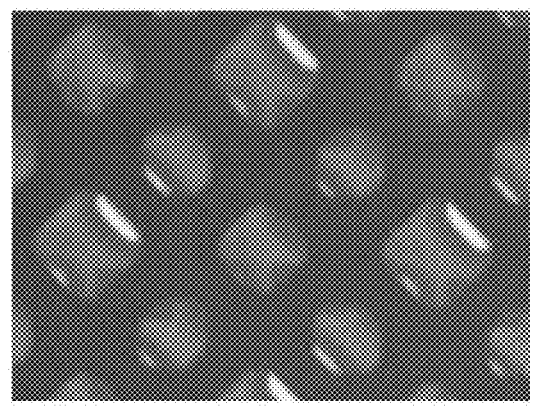

FIGS. 14A, 14B, and 14C are schematic views each illustrating a misalignment problem occurring in the comparative embodiment.

Referring to FIGS. 14A, 14B, and 14C, in the comparative embodiment, the light blocking layer 450 may be formed on the encapsulation substrate 400, and the misalignment problem may occur in case that the encapsulation substrate 400 and the lower display panel are attached using the sealant 410. In FIGS. 14A, 14B, and 14C, a structure in which the light emitting region is at least partially covered by the light blocking layer due to the misalignment is shown.

However, in the embodiment, the encapsulation substrate 400 may not have a light blocking structure and the low-reflection inorganic layer LRIL and the reflection control layer RCL corresponding to the light blocking layer may be formed at the lower display panel so that the misalignment problem may not occur.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A light emitting display device, comprising:
a driving element layer disposed on a substrate;
a light emitting element layer disposed on the driving element layer; and
an external light decreasing layer disposed on the light emitting element layer, wherein
the light emitting element layer includes:
an anode;
a pixel defining film having a first opening exposing at least a portion of the anode;
a light emitting layer disposed on the anode in the first opening of the pixel defining film; and
a cathode disposed on the light emitting layer and the pixel defining film, and
the external light decreasing layer includes an inorganic material having an absorption coefficient of greater than or equal to about 1.5 and comprises a reflection control layer having a second opening corresponding to the first opening of the pixel defining film.

2. The light emitting display device of claim 1, wherein the reflection control layer includes bismuth (Bi), ytterbium (Yb), magnesium (Mg), calcium (Ca), manganese (Mn), tin (Sn), zinc (Zn), indium (In), the like, or a combination thereof.

3. The light emitting display device of claim 1, wherein the external light decreasing layer further comprises a low-reflection inorganic layer, and
the low-reflection inorganic layer overlaps the first opening of the pixel defining film in a plan view.

4. The light emitting display device of claim 3, wherein the low-reflection inorganic layer includes an inorganic material having an absorption coefficient of greater than or equal to about 0.5 and a refractive index of greater than or equal to about 1.

5. The light emitting display device of claim 4, wherein the low-reflection inorganic layer includes bismuth (Bi).

6. The light emitting display device of claim 3, wherein the external light decreasing layer further comprises a capping layer.

7. The light emitting display device of claim 6, wherein
the reflection control layer is disposed on the capping layer, and
the low-reflection inorganic layer is disposed on the reflection control layer.

8. The light emitting display device of claim 6, wherein
the low-reflection inorganic layer is disposed on the capping layer, and
the reflection control layer is disposed on the low-reflection inorganic layer.

9. The light emitting display device of claim 6, wherein
the capping layer is disposed on the reflection control layer, and
the low-reflection inorganic layer is disposed on the capping layer.

10. The light emitting display device of claim 1, wherein
an area of the second opening of the reflection control layer is greater than an area of the first opening of the pixel defining film in a plan view, and
the second opening overlaps the first opening of the pixel defining film in a plan view.

11. The light emitting display device of claim 1, wherein
the substrate, the driving element layer, the light emitting element layer, and the external light decreasing layer are disposed in a lower display panel,
the light emitting element layer further includes:
an encapsulation substrate facing the lower display panel;
a sealant attaching the lower display panel and the encapsulation substrate; and
a filling layer disposed between the lower display panel, the encapsulation substrate, and the sealant, and
the light emitting display device does not comprise a polarizing plate.

12. A light emitting display device, comprising:
a driving element layer disposed on a substrate;
a light emitting element layer disposed on the driving element layer; and
an external light decreasing layer disposed on the light emitting element layer, wherein
the light emitting element layer includes:
an anode;
a pixel defining film having a first opening exposing at least a portion of the anode;
a light emitting layer disposed on the anode in the first opening of the pixel defining film; and
a cathode disposed on the light emitting layer and the pixel defining film,
the external light decreasing layer comprises a reflection control layer and a low-reflection inorganic layer,
the reflection control layer includes an inorganic material having an absorption coefficient of greater than or equal to about 1.5 and has a second opening corresponding to the first opening of the pixel defining film, and
the low-reflection inorganic layer includes an inorganic material having an absorption coefficient of greater than or equal to about 0.5 and a refractive index of greater than or equal to about 1.

13. The light emitting display device of claim 12, wherein the low-reflection inorganic layer includes bismuth (Bi).

14. The light emitting display device of claim 13, wherein the reflection control layer includes bismuth (Bi), ytterbium (Yb), magnesium (Mg), calcium (Ca), manganese (Mn), tin (Sn), zinc (Zn), indium (In), the like, or a combination thereof.

15. The light emitting display device of claim 12, wherein the external light decreasing layer further comprises a capping layer.

16. The light emitting display device of claim 15, wherein
the reflection control layer is disposed on the capping layer, and
the low-reflection inorganic layer is disposed on the reflection control layer.

17. The light emitting display device of claim 15, wherein
the low-reflection inorganic layer is disposed on the capping layer, and
the reflection control layer is disposed on the low-reflection inorganic layer.

18. The light emitting display device of claim 15, wherein
the capping layer is disposed on the reflection control layer, and
the low-reflection inorganic layer is disposed on the capping layer.

19. The light emitting display device of claim 12, wherein
an area of the second opening of the reflection control layer is greater than an area of the first opening of the pixel defining film in a plan view, and
the second opening overlaps the first opening of the pixel defining film in a plan view.

20. The light emitting display device of claim 12, wherein
the substrate, the driving element layer, the light emitting element layer, and the external light decreasing layer are disposed in a lower display panel,
the light emitting element layer further includes:
an encapsulation substrate facing the lower display panel;
a sealant attaching the lower display panel and the encapsulation substrate; and
a filling layer disposed between the lower display panel, the encapsulation substrate, and the sealant, and
the light emitting display device does not comprise a polarizing plate.

* * * * *